(12) United States Patent
Solcia

(10) Patent No.: US 11,984,178 B2
(45) Date of Patent: May 14, 2024

(54) METHODS AND DEVICES FOR FLEXIBLE RAM LOADING

(71) Applicant: STMicroelectronics S.r.l., Agrate Brianza (IT)

(72) Inventor: Gabriele Solcia, Mezzago (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 155 days.

(21) Appl. No.: 17/580,458

(22) Filed: Jan. 20, 2022

(65) Prior Publication Data
US 2023/0230650 A1    Jul. 20, 2023

(51) Int. Cl.
| | |
|---|---|
| *G11C 29/36* | (2006.01) |
| *G11C 7/10* | (2006.01) |
| *G11C 29/12* | (2006.01) |
| *G11C 29/46* | (2006.01) |
| *H03K 19/173* | (2006.01) |
| *H03K 19/20* | (2006.01) |

(52) U.S. Cl.
CPC ............ *G11C 29/36* (2013.01); *G11C 7/1036* (2013.01); *G11C 29/1201* (2013.01); *G11C 29/46* (2013.01); *H03K 19/1737* (2013.01); *H03K 19/20* (2013.01); *G11C 2029/3602* (2013.01)

(58) Field of Classification Search
CPC ... G11C 29/36; G11C 7/1036; G11C 29/1201; G11C 29/46; G11C 2029/3602; G11C 29/32; G11C 29/48; H03K 19/1737; H03K 19/20; G06F 11/2205; G06F 11/2273
See application file for complete search history.

(56) References Cited

U.S. PATENT DOCUMENTS

| | | | |
|---|---|---|---|
| 5,815,512 A * | 9/1998 | Osawa | G11C 29/32 365/201 |
| 6,018,815 A | 1/2000 | Baeg | |
| 7,890,824 B2 | 2/2011 | Douskey et al. | |
| 8,572,433 B2 | 10/2013 | Whetsel | |
| 8,650,524 B1 | 2/2014 | Chakravadhanula et al. | |
| 10,366,742 B1 * | 7/2019 | Penney | G11C 7/106 |
| 10,892,775 B1 * | 1/2021 | Katta | H03K 5/135 |
| 2010/0205490 A1 | 8/2010 | Louie et al. | |

* cited by examiner

*Primary Examiner* — Mohammed A Bashar
(74) *Attorney, Agent, or Firm* — Slater Matsil, LLP

(57) ABSTRACT

A flexible RAM loader including a shift register that includes a first data section coupled with a serial data input, and a second data section selectively coupled with a first parallel data input. The shift register is configured to load data serially from the serial data input to the first data section and the second data section when the second data section is uncoupled from the first parallel data input, and, when the second data section is coupled with the first parallel data input, configured to load data in parallel from the serial data input into the first data section and from the first parallel data input into the second data section. The flexible RAM loader also including a test register comprising a selection bit to couple the second data section with the first parallel data input.

21 Claims, 7 Drawing Sheets

METHODS AND DEVICES FOR FLEXIBLE RAM LOADING

TECHNICAL FIELD

The present invention relates generally to a systems and methods for loading data into a RAM.

BACKGROUND

Some functional features of microcontroller devices may be tested using load RAM tester patterns. However, RAM loading approaches may utilize serial data loading. This can undesirably increase the amount of time needed to perform test operations. Faster RAM loading devices and methods can expedite testing processes.

SUMMARY

In accordance with an embodiment, a flexible RAM loading device includes a shift register that includes a first data section, a second data section, and a first shift-register selection bit. The flexible RAM loading device further includes a test register including a data section and a first test-register selection bit, the first test-register selection bit being loaded from the first shift-register selection bit; and a first shift-register MUX including: a first input coupled with an output of the first data section; a second input coupled with a first external data pin; an output coupled with an input of the second data section; and a selection input coupled with the first test-register selection bit, the output of the first shift-register MUX depending the first test-register selection bit.

In accordance with an embodiment, the flexible RAM loading device further includes wherein a serial data input is coupled with an input of the first data section to load data serially into the first data section.

In accordance with an embodiment, the flexible RAM loading device further includes, wherein the shift register includes RAM addressing bits, a MUX enable bit, and a RAM function bit, wherein the test register includes RAM addressing bits that are loaded from the RAM addressing bits of the shift register, and a RAM function bit that is loaded from the RAM function bit of the shift register, a MUX enable bit that is loaded from the shift register, and further wherein the data section of the test register is loaded from the shift register.

In accordance with an embodiment, the flexible RAM loading device further includes, wherein the MUX enable bit of the test register is provided to a selection input of MUX that toggles an output of the MUX between functional RAM control signals, and the RAM addressing bits of the test register, the RAM function bit of the test register, and the data section of the test register.

In accordance with an embodiment, the flexible RAM loading device further includes: a second shift-register MUX including: a first input coupled with an output of the second data section; a second input coupled with a second external data pin; an output coupled with an input of a third data section of the shift register; and a selection input coupled with a second test-register selection bit, the output of the second shift-register MUX depending the second test-register selection bit and the first test-register selection bit.

In accordance with an embodiment, the flexible RAM loading device further includes, wherein the second test-register selection bit is loaded from a second shift-register selection bit.

In accordance with an embodiment, the flexible RAM loading device further includes, wherein the first test-register selection bit is coupled with a first input of an OR gate and the second test-register selection bit is coupled with a second input of the OR gate, an output of the OR gate being coupled with the selection input of the second shift-register MUX.

In accordance with an embodiment, the flexible RAM loading device further includes a third shift-register MUX including: a first input coupled with an output of the second data section; a second input coupled with a third external data pin; an output coupled with an input of a fourth data section of the shift register; and a selection input coupled with the first test-register selection bit, the output of the third shift-register MUX depending on the first test-register selection bit.

In accordance with an embodiment, a method to load data into a RAM includes: setting a parallel loading mode of a flexible RAM loader depending on a number of free pins available for parallel loading; loading data into a shift register in parallel from each of the number of free pins available for parallel loading and a data input; and transmitting data loaded into the shift register to the RAM.

In accordance with an embodiment the method further includes, executing test operations determined by the data transmitted to the RAM by a central processor unit to perform.

In accordance with an embodiment, the method further includes, wherein the number of free pins available equals one.

In accordance with an embodiment, the method further includes, wherein the number of free pins available equals seven.

In accordance with an embodiment, the method further includes, setting the flexible RAM loader to a different parallel mode in response to a change in the number of free pins available for parallel loading.

In accordance with an embodiment, the method further includes, setting the flexible RAM loader to a serial loading mode in response to a change in the number of free pins available for parallel loading.

In accordance with an embodiment, the method further includes, wherein setting the parallel loading mode of the flexible RAM loader includes loading configuration bits into the shift register and transmitting the configuration bits to a test register.

In accordance with an embodiment, the method further includes, wherein transmitting data loaded into the shift register to the RAM includes transmitting the data into the shift register, enabling a MUX to output the data, and providing the data to the RAM.

In accordance with an embodiment, the method further includes, wherein data loaded into the shift register originates from Automatic Tester Equipment.

In accordance with an embodiment, a flexible RAM loader includes a shift register including a first data section coupled with a serial data input, and a second data section selectively coupled with a first parallel data input, the shift register being configured to load data serially from the serial data input to the first data section and the second data section when the second data section is uncoupled from the first parallel data input, and, when the second data section is coupled with the first parallel data input, configured to load data in parallel from the serial data input into the first data section and from the first parallel data input into the second data section; and a test register including a selection bit to couple the second data section with the first parallel data input.

In accordance with an embodiment a flexible RAM loader further includes, wherein the shift register further includes a third section selectively coupled with a second parallel data input.

In accordance with an embodiment, a flexible RAM loader further includes, wherein the test register includes a selection bit to couple the third section with the second parallel data input.

In accordance with an embodiment, a flexible RAM loader further includes an Error Correction Code Generation Circuit to calculate an error correction code from data provided to the flexible RAM loader.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Integrated circuits have long incorporated embedded components that may lack externally accessible pins. These components, however, just like any other component, may be subject to performance variations for any variety of reasons such as, but not limited, manufacturing and other defects. The need for testing these embedded components, and systems of embedded components, on integrated circuits prompted the development of alternative approaches.

The Joint Test Action Group (JTAG) was formed for addressing these challenges. IEE 1149.1-2013 contain some relevant standards. Many microcontroller devices now comprise JTAG ports that provide access to internal embedded components for testing, debugging, and fault isolation for embedded systems. These access ports are now used for wide variety of testing and debugging operations on integrated circuits.

Some testing operations for microcontroller devices are tested through Load-Ram-Execute ("LRE") tester patterns. This may be true for testing that is not performed with Automatic Testing Pattern Generation or Memory Build in Self Test, and other specific Design for Testability modes. Some, non-limiting, example are consumption measurements with a device in a specific functional configuration, or testing of functional critical paths not covered by Automatic Test Pattern Generation.

LRE patterns and tests may be performed by loading functional code onto a System on a Chip ("SoC"). The code may be loaded onto a system RAM from Automatic Tester Equipment ("ATE") coupled with the SoC for testing purposes. An ATE may be coupled with an interface (such as a JTAG interface) to transmit the data that is transferred to the system RAM. After the system RAM is loaded with the functional code, a CPU for the SoC may execute the functional code. Test result data may be then be provided back to the ATE where the results may be analyzed and evaluated.

DFT interfaces have one pin available to load data for a system RAM. As a result, data is loaded serially, which can be extremely time consuming. Test patterns may require loading several kilobits of content onto the system RAM for execution by a system CPU. And, the time perform such tests may thus become undesirably long.

Figure 1:
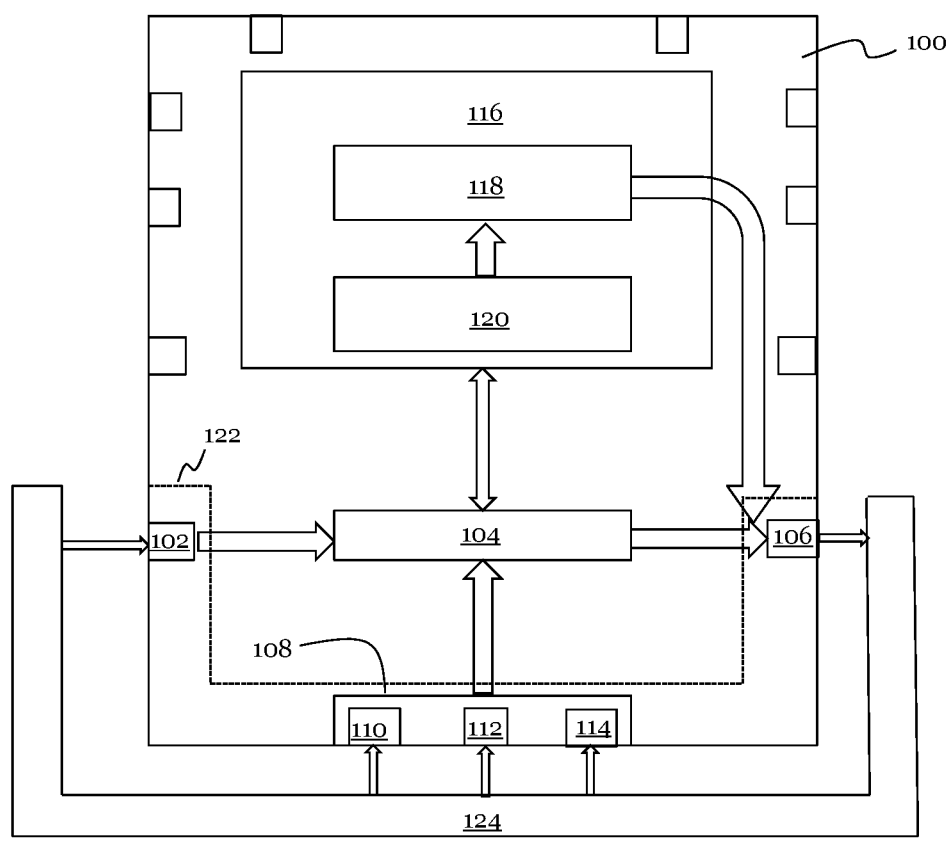
FIG. 1 illustrates a Design For Testing system for a system on a chip in accordance with an embodiment.

FIG. 1 illustrates a Design For Testing system for a system on a chip in accordance with an embodiment.

A SoC 100 may comprise a test data input 102. The test data input 102 may be coupled with register block 104. The register block 104 may also be coupled with a test data output 106. The SoC may further comprise a test controller 108. In various embodiments, the test controller 108 may be coupled with a clock input no and a test mode select 112. The test controller may also be coupled with a reset input 114. There may also be additional inputs for the test controller. The SoC may further comprise additional pins. The SoC may comprise a microcontroller 116. The microcontroller 116 may comprise a CPU 118 and a System RAM 120. The test data input 102, test data output 106, clock input 110, test mode select 112, and reset input 114 may all be disposed at an interface 122 (such as a JTAG interface), where an ATE may be coupled with the SoC 100. The test controller 108 may also comprise the test data input 102 and the test data output 106.

The test controller may comprise a JTAG Test Access Port ("TAP" controller). Accordingly, the test controller 108 may comprise a Finite State Machine whose outputs and state transitions are determined by a signal received from the test mode select input and the clock input. The reset input may reset the state of the test controller 108, as its name indicates.

The register block 104 may store data serially loaded from the test data input 102 depending on control signals received from the test controller 108, which in turn may depend on the state of the test controller 108. The register block may provide data to the test data output 106 depending on the signals received from the test controller.

For LRE tests, data received from the test data input may be stored in the register block 104. Data may be loaded one bit at a time into a shift register. Subsequently, data may be loaded to the System RAM 120 where it be executed by the CPU 118 and results may be delivered to the test data output 106. The test data input 102, clock input no, and test mode select 112 may all be coupled with an ATE 124, which can then control LRE tests. The ATE may also be coupled with the test data output 106 to receive the results of any tests performed. And, an ATE may assert a reset signal coupled with the reset input 114 during test operations. While an LRE test is being performed some or all of the additional pins on the SoC may be unused or otherwise available.

Figure 2:
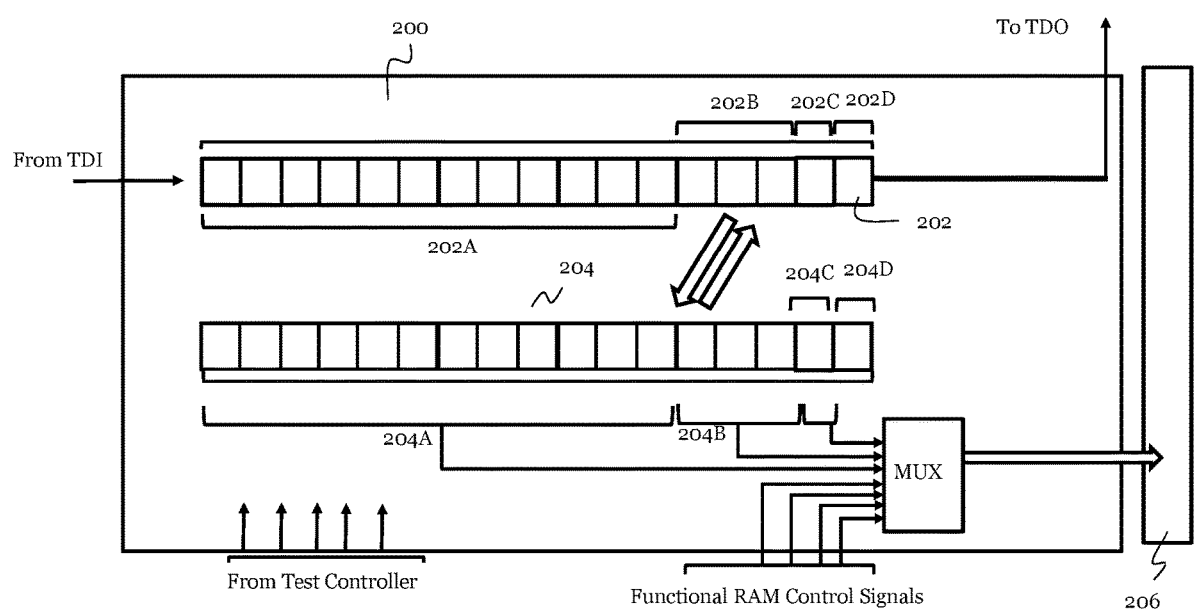
FIG. 2 depicts a known register block that loads data from a test data input in a serial manner.

FIG. 2 depicts a known register block that loads data from a test data input in a serial manner.

The register block 200 includes a shift register 202, and a test register 204. The shift register 202 is also coupled with the test data output 106. The shift register includes data bits 202A and addressing bits 202B. RAM R/W bits 202C, and a MUX enable bit 202D are also included.

The register block 200 also includes a test register 204. The test register includes data bits 204A and addressing bits 204B. RAM R/W bits 204C and a MUX enable bit 204D are also included.

The register block 200 receives control signals from a test controller. Data is loaded into the shift register 202 one bit at a time when as directed by control signals received from a test controller. Once loaded, the data is transferred to the test register. A MUX intercepts the functional RAM control signals and toggles them to the signals received from the test register 204. The signals are then delivered to the System RAM 206 where they can be executed.

Serially loading the shift register 202 can undesirably consume time. As already referenced, kilobits of data (or more) may be loaded. As a result, thousands of cycles may be necessary to load test data onto the system RAM. This creates a bottleneck that slows down test time and, thus, can also slow down the process for manufacturing components. Systems and methods that allow quicker loading of data, thus, provide advantages.

Figure 3:
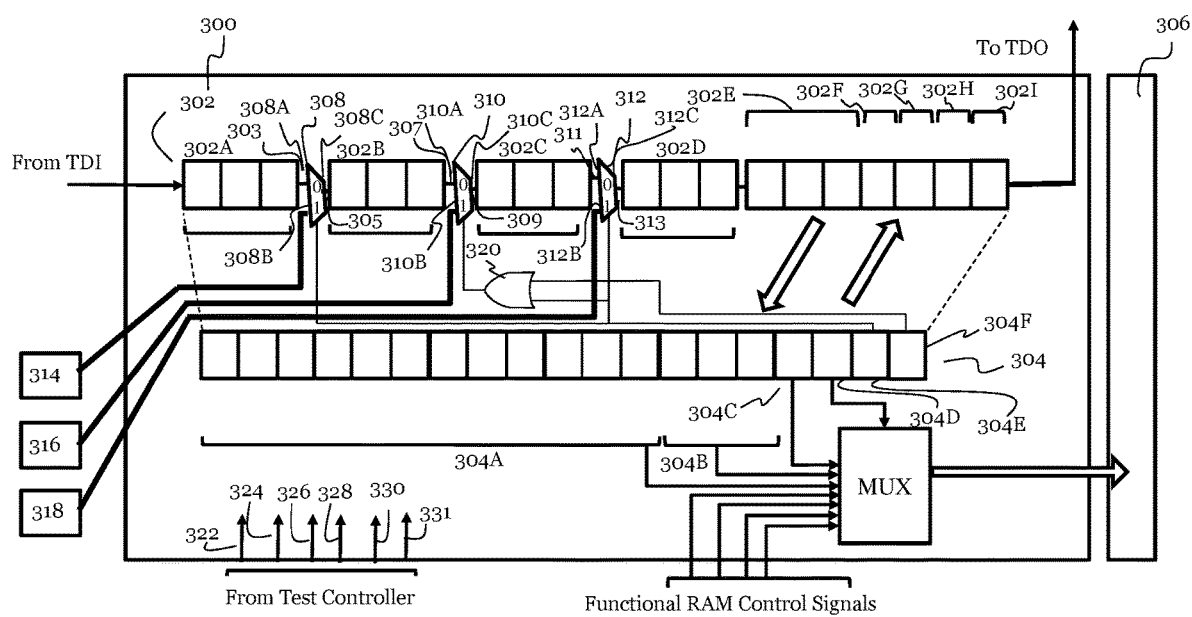
FIG. 3 depicts a flexible RAM loader consistent with an embodiment.

FIG. 3 depicts a flexible RAM loader in consistent with an embodiment. The flexible RAM loader 300 may comprise a shift register 302 and a test register 304. The shift register 302 may comprise a first section 302A, a second section 302B, a third section 302C and a fourth section 302D. Any, or all, of the first section 302A, second section 302B, third section 302C and fourth section 302D may store data bits. The size (in terms of the number of bits they may store) of the first section 302A, second section 302B, third section 302C, and fourth section 302D may be uniform or one or more of the sections may have space for more or fewer bits than other sections. It should also be appreciated that the shift register 302 may comprise additional sections in various embodiments. And, in various embodiments, the shift register 302 may comprise fewer sections.

The shift register 302 may also comprise locations for RAM addressing bits 302E. The number of addressing bits may vary among embodiments. The shift register 302 may comprise a RAM R/W bit 302F, which may be referred to as a RAM function bit. The shift register 302 may comprise a MUX-enable bit 302G. The shift register 302 may comprise a location for a first selection bit 302H. The shift register may comprise a location for a second selection bit 302I. The shift register 302 may comprise more or less locations for selection bits. And, as will be appreciated, the shift register 302 may comprise locations for additional bits or be of a different size than as illustrated here.

The test register may comprise locations for data bits 304A. The total number of locations for data bits of the test register 304 may be equal to the total number of data bits for the shift register. For example, the sum of the bits for the first section 302A, second section 302B, third section 302C, and fourth section 302D may equal the number of data bits in the test register 304. For example, the shift register 302 may include 12 data bits (three bits for each of the first section 302A, second section 302B, third section 302C, and fourth section 302D and the test register 304 may have 12 data bits. All of the bits of the shift register 302 may be output in parallel to the test register 304. This may be accomplished in various embodiments by bussing.

The test register 304 may also comprise locations for RAM addressing bits 304B. The number of addressing bits may vary among embodiments. And, again, the number of addressing bits of the test register may correspond to the number of addressing bits of the shift register 302.

The test register 304 may comprise a RAM R/W bit 304C, which may be referred to as RAM function bit. The test register 304 may comprise a MUX enable bit 304D. The test register 304 may comprise a location for a first selection bit 304E. The test register 304 may comprise a location for a second selection bit 304F. The test register 304 may comprise more or less locations for selection bits. And, the number of selection bits of the test register may correspond to the number of selection bits for the shift register 302.

As will be appreciated, the size of the shift register 302 may correspond to the size of the test register 304. Data may be loaded from the shift register 302 to the test register 304 in parallel. It may only take one cycle to transfer data from the shift register 302 to the test register 304.

The flexible RAM loader 300 may further comprise a MUX that toggles an output between the Functional RAM Control Signals and inputs received from the test register 304. Functional RAM Control Signals may include an addressing signal, a data signal, a mode signal, a CSN signal, and a CK signal. The CSN signal may comprise a chip select. In various embodiments, a RAM clock signal may be derived from a clock signal from the test controller 108 (such as a signal provided to clock input no). In various embodiments, a RAM clock signal may be asserted when write operations for the RAM are ordered. In various embodiments, a RAM clock signal may rise and fall simultaneously with a clock signal from the test controller 108 while the CSN signal is asserted only when a write operation for the RAM is ordered.

The MUX enable bit 304D may be provided to an input of the MUX to select the output of the MUX. For example, when the MUX enable bit 304D is asserted, the MUX may output that data received from the test register 304 and when it is not asserted the MUX may output the function RAM control signals. As will be appreciated the value of the MUX enable bit 304D used to toggle the output may vary. For example, a "1" may control the MUX to output data from the test register 304 while a "0" may control the MUX to output the Functional RAM control signals in some embodiments. And, in various embodiments, a "0" may control the MUX to output data from the test register 304 while a "1" may control the MUX to output the Functional RAM Control Signals, in some embodiments. The output of the MUX may be provided to a System RAM 306 where it may be executed by a system CPU or other processor.

In various embodiments, the flexible RAM loader 300 may further comprise a first shift-register MUX 308, a second shift-register MUX 310, and a third shift-register MUX 312. The flexible RAM loader 300 may comprise more shift-register MUXes or less shift-register MUXes in various embodiments.

The first shift-register MUX 308 may be coupled at an input 308A of the first shift-register MUX 308 with an output 303 of the first section 302A of the shift register 302. The first shift-register MUX 308 may be coupled at an input 308B of the first shift-register MUX 308 with a first TO pin 314. An output 308C of the first shift-register MUX 308 may be coupled with the second section 302B of the shift register 302 at an input 305. The first shift-register MUX 308 may be coupled at a selection input with a bit of the test register 304. Thus, depending on the state of the selection input of the first shift-register MUX 308, the second section 302B will either receive the output of the first section 302A of the shift register 302 or the output of the first IO pin 314.

The second shift-register MUX 310 may be coupled at an input 310A of the second shift-register MUX 310 with an output 307 of second section 302B of the shift register 302. The second shift-register MUX 310 may be coupled at an input 310B of the second shift-register MUX 310 with a second IO pin 316. An output 310C of the second shift-register MUX 310 may be coupled with an input of the third section 302C of the shift register 302 at an input 309. The second shift-register MUX 310 may be coupled at a selection input with a bit of the test register 304. Thus, depending on the state of the selection input of the second shift-register MUX 310, the third section 302C will either receive the output of the second section 302B of the shift register 302 or the output of the Second IO pin 316.

The third shift-register MUX 312 may be coupled at an input 312A of the third shift-register MUX 312 with an output 311 of third section 302C of the shift register 302. The third shift-register MUX 312 may be coupled at an input 312B of the third shift-register MUX 312 with a third IO pin 318. An output 312C of the third shift-register MUX 312 may be coupled with an 313 input of the fourth section 302D of the shift register 302. The third shift-register MUX 312 may be coupled at a selection input with a bit of the test register 304. Thus, depending on the state of the selection input of the third shift-register MUX 312, the fourth section 302D will either receive the output of the third section 302C of the shift register 302 or the output of the Third IO pin 318. In various embodiments, the flexible RAM loader 300 may further comprise an OR gate 320.

A flexible RAM loader 300 allows data to be loaded from the test data input 102 and from additional pins in parallel. As will be appreciated, this can reduce the amount of time needed to load data and thus reduce the amount of time needed to perform test operations. The amount of time saved may depend on the size of the data, and the number of inputs being used to load data.

In various embodiments, the flexible RAM loader 300 may also allow the number of input ports being used for parallel loading to be varied depending on a selection mode of the flexible RAM loader 300. This may be advantageous because, depending on when a LRE test is being performed, a SoC boo may have different numbers of free pins available. If three pins are available (in addition to the test data input 102) all three pins may be utilized for parallel loading. If only one pin is available (in addition to the test data input 102) the flexible RAM loader 300 may just utilize the single free pin for parallel loading. If no free pins are available, the flexible RAM loader 300 may load data serially. Free pins may be coupled with an ATE for the parallel loading. In various embodiments, the mode of the flexible RAM loader may be reset as additional pins become available or pins are needed for other operations. Thus, the number of pins used for parallel loading may be reprogrammed during testing by updating relevant selection bits (for example, first selection bit 302H and second selection bit 302I).

In various embodiments, the flexible RAM loader 300 may receive control signals from the test controller 108. For example, the flexible RAM loader 300 may receive a data-register enable signal 322. In various embodiments, Signal 322 may be active when a specific instruction from test controller is loaded. For example, the flexible RAM loader 300 may exchange data a test controller (TDI from test controller, TDO to test controller). Otherwise the test controller may interact with other test registers of a SoC, different from the ones related to the flexible RAM loader The flexible RAM loader 300 may also receive an UPDATE signal 324. When asserted, the UPDATE signal may cause data from the shift register 302 to be loaded to the test register 304. The flexible RAM loader 300 may also receive a SHIFT signal 326. When asserted the SHIFT signal may cause data to be loaded into the shift register 302. This may occur as data is shifted out of the shift register. For example, data may be shifted in from TDI and out TDO, simultaneously. Depending on the other configurations of the flexible RAM loader 300, data may shift may occur serially or in parallel. The flexible RAM loader 300 may also receive a CAPTURE signal 328. When asserted, the CAPTURE signal 328 may cause data from the test register 304 to be transferred the shift register 302. The flexible RAM loader 300 may also receive a RESET signal 330. The RESET signal, when asserted may cause the removal of the data stored in the shift register. The flexible RAM loader 300 may also receive a clock signal 331 from the test controller, which may originate from an ATE. As will be appreciated these control signals may be asserted and de-asserted depending on the state of the test controller 108.

By way of a non-limiting example, data may be loaded into a system RAM 306 for an LRE after an ATE has been coupled a test interface. The ATE may provide signals through a test interface to the test controller 108, which in turn provides control signals to the flexible RAM loader 300. Initially, the SHIFT signal 326 may be asserted as configuration data is loaded into the shift register 302 from the test data input 102. The initial data may include data for the RAM addressing bits 302E, MUX-enable bit 302G, first selection bit 302H, and the second selection bit 302I. Thus, the initial data may configure the flexible RAM loader for the number of inputs used for parallel loading.

After initial data has been loaded into the shift register 302, the UPDATE signal 324 may be asserted. This may cause the data stored in the shift register 302 to be loaded into the test register 304. For example, data loaded into the first section 302A, second section 302B, third section 302C and fourth section 302D may be loaded into data bits 304A. Bits from RAM addressing bits 302E may be loaded to RAM addressing bits 304B. Data from RAM R/W bit 302F may be loaded to RAM R/W bit 304C. Data from 302G may be loaded to bit 304D. Data from first selection bit 302H and second selection bit 302I may be loaded to first selection bit 304E and second selection bit 304F, respectively.

As will be appreciated, depending on the value for the MUX enable bit stored in the test register 304, the functional RAM control signals may be bypassed in favor of signals from the test register 304. Data can then be loaded to the system RAM 306 to an address as indicated by RAM addressing bits 304B.

The values of first selection bit 304E and second selection bit 304F may control the outputs of the first shift-register MUX 308, second shift-register MUX 310, and third shift-register MUX 312. This may allow the shift register 302 operate in one or more parallel modes.

FIG. 3 depicts a flexible RAM loader 300 comprising three modes for loading data. The first selection bit 304E may be coupled with selection input of the first shift-register MUX 308 and the selection input of the third shift-register MUX 312. The first selection bit 304E and the second selection bit 304F may be coupled with the inputs of the gate 320. And, the output of the OR gate 320 may be coupled with the selection input of the second shift-register MUX 310.

In a one mode, a serial mode, the flexible RAM loader 300 may operate like a classical serial data loader. The flexible RAM loader 300 may be programmed into this mode by de-asserting the first selection bit 304E and the second selection bit 304F, which can be accomplished by loading the desired bit in the first selection bit 302H and second selection bit 302I. The first shift-register MUX 308 will then output data from the first section 302A, the second shift-register MUX 310 will output data from the second section 302B and the third shift-register MUX 312 will output data from the third section 302C. Thus, the shift register 302 will function traditionally as a shift register 202.

If there is one available pin for parallel loading, the flexible RAM loader 300 may be configured for another mode (a two-section mode). This may be accomplished, in various embodiments (and as depicted in FIG. 3) by setting the second selection bit 304F to a de-asserted state. In various embodiments, the second selection bit 304F and the first selection bit 304E may be provided to the input of the OR gate 320. The output of the OR gate may be propagated to the selection input of the second shift-register MUX 310. The first selection bit 304E may be de-asserted. The selection input of the first shift-register MUX 308 and the selection input of the third shift-register MUX 312 may be coupled with first selection bit 304E. As the first selection bit is de-asserted, the first shift-register MUX 308 will continue pass the output of the first section 302A while the third shift-register MUX 312 will continue to output the third section 302C. Meanwhile, the OR gate 320 will output the asserted value of the second selection bit 304F and the second shift-register MUX 310 will pass data received from the second IO pin 316. The first section 302A may then receive data from test data input 102 and the third section 302C may receive data from the second IO pin 316. As the cycles continue, more data can be added to the first section 302A and the second section 302B from the test data input 102 while more data is added in parallel from the second IO pin 316 to the third section 302C and the fourth section 302D. This may significantly reduce the time needed to provide data to the system RAM 306.

In one mode, the flexible RAM loader 300 may be configured to utilize data input from three available pins. For example, the test data input 102 may provide data to the first section 302A, the first IO pin 314 may provide data to the second section 302B, the second IO pin 316 may provide data to the third section 302C, and the third IO pin 318 may provide data to the fourth section 302D. This may be accomplished by setting the first selection bit 304E and the second selection bit 304F to an asserted state. This may also be accomplished, in various embodiments, by setting just 304E to an asserted state (as 304E may be provided to OR gate 320). Then the first shift-register MUX 308 will pass data from the first IO pin 314. The second shift-register MUX 310 will pass data from the second IO pin 316. The third shift-register MUX 312 will pass data from the third IO pin 318. And, the first section 302A will receive data from the test data input 102.

As will be appreciated, the flexible RAM loader 300 may comprise additional modes and may be comprise different arrangements to allow the different modes. For example, embodiments wherein the shift register 302 comprise more sections (and more MUXes) the flexible RAM loader 300 may comprise more modes to take advantage of additional pins (when available). Further, different combinations of different sections may be accomplished. In various modes, the shift register 302, and correspondingly the test register 304, may comprise additional selection bits. In various embodiments, there may be a selection bit for each shift-register MUX. In various embodiments, the flexible RAM loader 300 may comprise only one selection bit and only have a serial mode and a parallel mode. As will be appreciated, such an embodiment may have one or more shift-register MUX, which each receives the same selection bit as at a selection input. Numerous different embodiments may comprise numerous different modes achieved from numerous different arrangements. And, for brevity, only some examples are explained herein.

Figure 4:
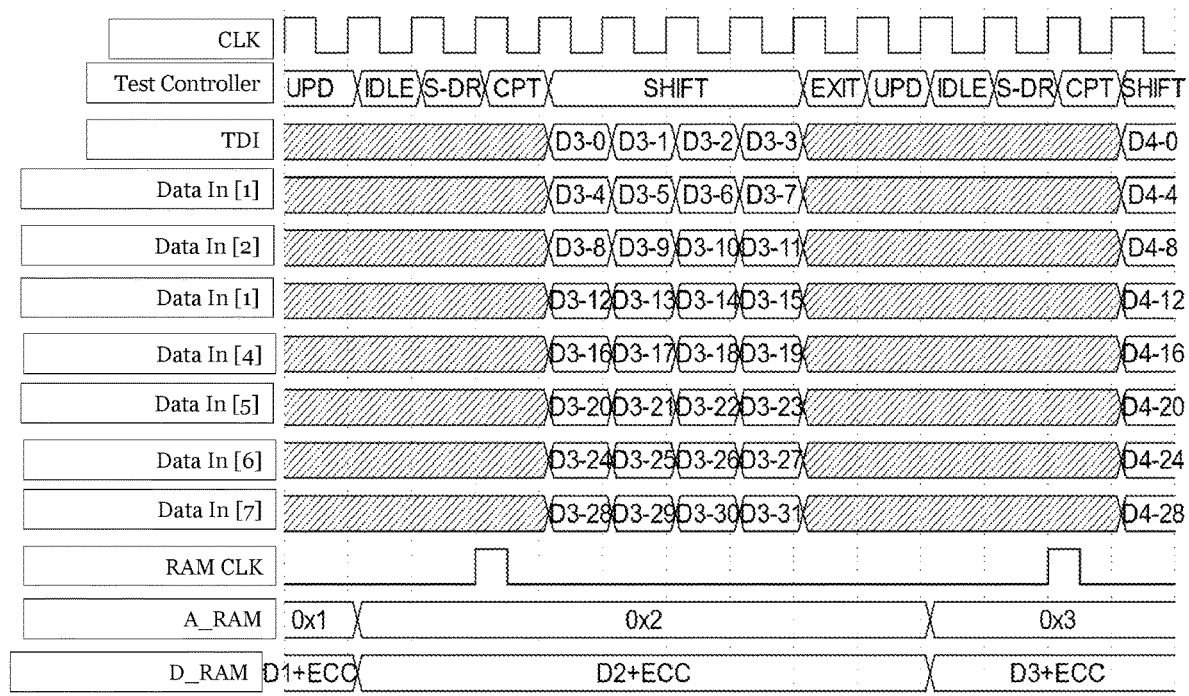
FIG. 4 depicts waveforms for control signals and data signals for flexible RAM loading.

FIG. 4 depicts waveforms for control signals and data signals for flexible RAM loading.

FIG. 4 depicts 13 waveforms. The waveforms depicted in FIG. 4 may correspond to a flexible RAM loader 300 with eight sections that are four bits each providing a total of 32 data bits. The flexible RAM loader 300 for these waveform is operating in a mode where the eight sections are loaded in parallel using a test data input (such as test data input 102) and seven additional IO pins.

The first waveform corresponds to a CLK signal. The CLK may be provided by an ATE to clock input no. The second waveform depicts the state of a test controller (such as test controller 108), which may comprise a TAP controller. As referenced earlier the states of the test controller 108 may depend on the inputs to the test controller 108 from an ATE and the progression of the clock. The third waveform corresponds to data received from the test data input (such as test data input 102). The fourth waveform through the tenth waveform correspond to data received from corresponding IO pins and provided to a respective section of a shift register 302 of a flexible RAM loader 300. Finally, the eleventh, twelfth, and thirteenth waveforms correspond to a RAM clock, and addressing for the RAM. The RAM clock may be derived by from CLK being set to a TAP clock. The RAM clock may then be allowed to be asserted for only one clock cycle for each RAM write operation. As illustrated in FIG. 4, the RAM clock is asserted during CAPTURE state of the test controller. The ARAM waveform may provide the RAM address (the location where the data is being loaded). This may be derived from addressing bits 304B. In a first RAM write operation, the addressing information may come directly from addressing bits 304B. In the subsequent RAM writes, automatically increased by 1. The D_RAM may comprise the RAM data. It may directly come from data bits 304A. In various embodiments, the D_RAM waveform may come from 502 in case of the automatic hardware-based ECC generation.

As depicted in FIG. 4, the test controller may cycle through an update state, idle state, S-DR state (select data register) and capture state before entering a SHIFT state (shift device register state). During a first clock cycle of the SHIFT state, data will be loaded in parallel to a first bit of each of the 8 sections from their corresponding data sources. During a second clock cycle of the SHIFT state, data is shifted to second bit of each section and a new bit of data loaded in each section. This continues in parallel for until each section in full. Then, the test controller may proceed to an EXIT state. The test controller 108 will continue to cycle and proceed to another update state. In the update state, the data stored in the shift register 302 may be transferred to the test register 304. From there it may be transmitted to the system RAM. The test controller will continue to cycle until it enters another shift state and data will be loaded in parallel into the sections of the shift register 302 again.

Parallel loading allowed by flexible RAM loader 300 can significantly impact the number of cycles needed to load data. A test of an embodiment of a flexible RAM loader 300 comprising eight sections loaded in parallel saw a reduction over a serial loaded register block for 1 RAM data from 72 cycles to 13 cycles.

Further increases in efficiencies may be realized by adding an Error Correction Code Generator 502 to the flexible RAM loader 300.

Figure 5:
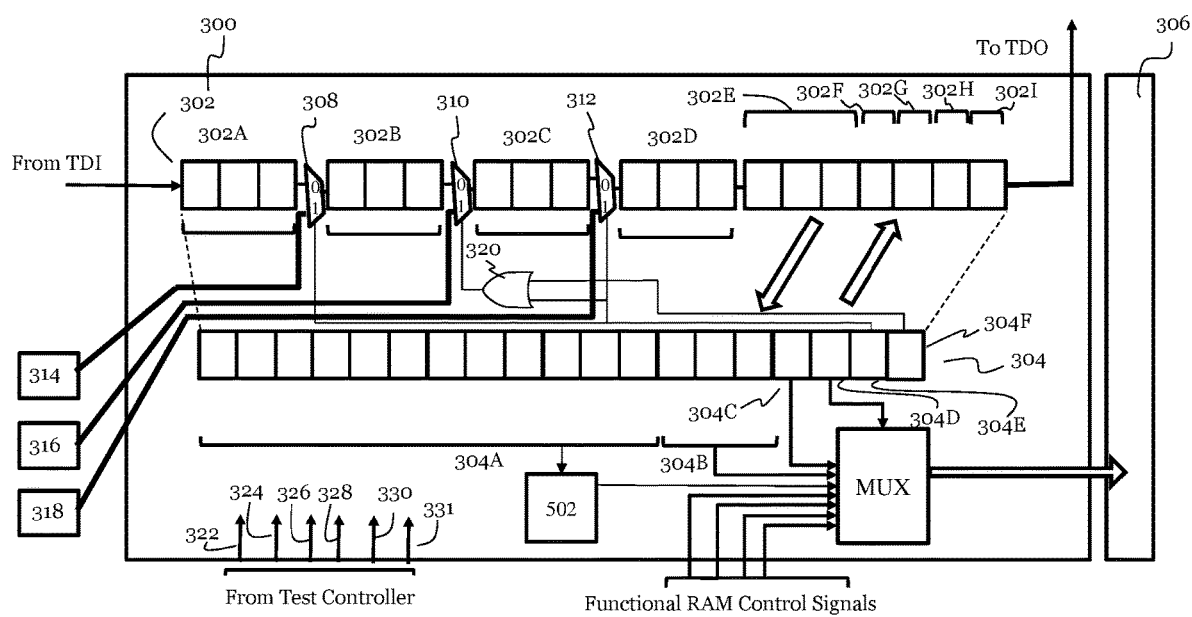
FIG. 5 depicts a flexible RAM loader comprising an Error Correction Code Generator consistent with an embodiment.

FIG. 5 depicts a flexible RAM loader comprising an Error Correction Code Generator consistent with an embodiment.

As will be appreciated, an Error Correction Code may comprise a number of additional bits derived from the data bits of the register content. Error Correction Code Generation may be performed on SoC thereby avoiding transmission of the Error Correction Code bits from an ATE to a SoC. This will save the cycles needed for such a transmission. An Error Correction Code Generator 502 may also be added to a traditional register block such as register block 104 that does not utilize flexible RAM loader. The Error Correction Code Generator 502 may comprise combinational logic gates, which receives the data (for example 32 data bits) and providing ECC bits (for example 7 ECC bits) as an output. In various embodiments, the ECC Code Generator may also be used for ECC generation during functional states.

Figure 6:
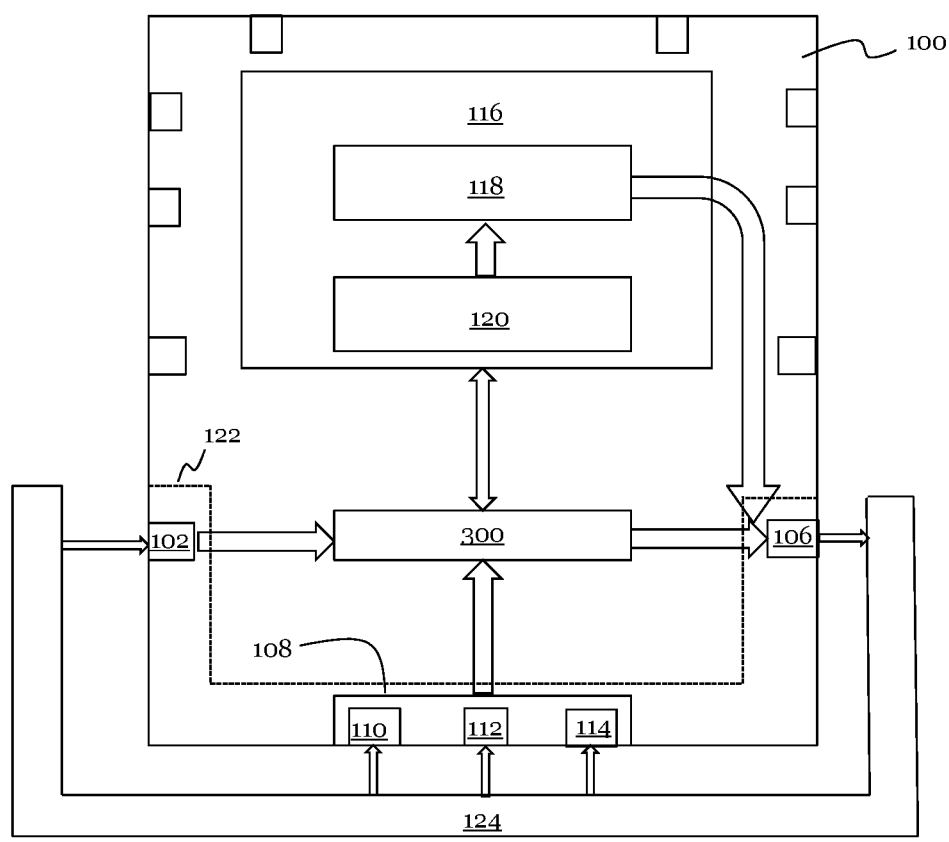
FIG. 6 depicts a Design for Testing System with a flexible RAM loader consistent with an embodiment.

FIG. 6 depicts a Design for Testing System with a flexible RAM loader consistent with an embodiment.

Unless otherwise noted, elements in the figures that are identified with the same numerals may represent the same component. In various embodiments, the flexible RAM loader 300 may be integrated into a Design for Testing System.

Figure 7:
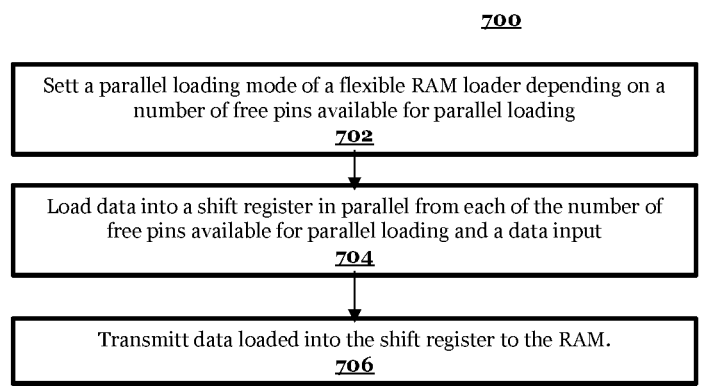
FIG. 7 depicts a method to load data into a RAM consistent with an embodiment.

FIG. 7 depicts a method to load data into a RAM consistent with an embodiment.

In various embodiments, a method 700 to load data into a RAM may comprise, at a step 702, setting a parallel loading mode of a flexible RAM loader depending on a number of free pins available for parallel loading; at a step 704, loading data into a shift register in parallel from each of the number of free pins available for parallel loading and a data input; and, at a step 706, transmitting data loaded into the shift register to the RAM.

In various embodiments, the method 700 may further comprise executing test operations determined by the data transmitted to the RAM by a central processor unit to perform.

In various embodiments, the method 700 may further comprise, wherein the number of free pins available equals one.

In various embodiments, the method 700 may further comprise, wherein the number of free pins available equals seven.

In various embodiments, the method 700 may further comprise setting the flexible RAM loader to a different parallel mode in response to a change in the number of free pins available for parallel loading.

In various embodiments, the method 700 may further comprise setting the flexible RAM loader to a serial loading mode in response to a change in the number of free pins available for parallel loading.

In various embodiments, the method 700 may further comprise, wherein setting the parallel loading mode of the flexible RAM loader comprises loading configuration bits into the shift register and transmitting the configuration bits to a test register.

In various embodiments, the method 700 may further comprise, wherein transmitting data loaded into the shift register to the RAM comprises transmitting the data into the shift register, enabling a MUX to output the data, and providing the data to the RAM.

In various embodiments, the method 700 may further comprise, wherein data loaded into the shift register originates from Automatic Tester Equipment.

Example 1. A flexible RAM loading device including: a shift register including a first data section, a second data section, and a first shift-register selection bit; a test register including a data section and a first test-register selection bit, the first test-register selection bit being loaded from the first shift-register selection bit; and a first shift-register MUX including: a first input coupled with an output of the first data section; a second input coupled with a first external data pin; an output coupled with an input of the second data section; and a selection input coupled with the first test-register selection bit, the output of the first shift-register MUX depending the first test-register selection bit.

Example 2. The flexible RAM loading device of Example 1, wherein a serial data input is coupled with an input of the first data section to load data serially into the first data section.

Example 3. The flexible RAM loading devices of Example 1 and Example 2, wherein the shift register includes RAM addressing bits, a MUX enable bit, and a RAM function bit, wherein the test register includes RAM addressing bits that are loaded from the RAM addressing bits of the shift register, and a RAM function bit that is loaded from the RAM function bit of the shift register, a MUX enable bit that is loaded from the shift register, and further wherein the data section of the test register is loaded from the shift register.

Example 4. The flexible RAM loading devices of Example 1 through Example 3, wherein the MUX enable bit of the test register is provided to a selection input of MUX that toggles an output of the MUX between functional RAM control signals, and the RAM addressing bits of the test register, the RAM function bit of the test register, and the data section of the test register.

Example 5. The flexible RAM loading devices of Example 1 through Example 4, further including: a second shift-register MUX including: a first input coupled with an output of the second data section; a second input coupled with a second external data pin; an output coupled with an input of a third data section of the shift register; and a selection input coupled with a second test-register selection bit, the output of the second shift-register MUX depending the second test-register selection bit and the first test-register selection bit.

Example 6. The flexible RAM loading devices of Example 1 through Example 5, wherein the second test-register selection bit is loaded from a second shift-register selection bit.

Example 7. The flexible RAM loading devices of Example 1 through Example 6, wherein the first test-register selection bit is coupled with a first input of an OR gate and the second test-register selection bit is coupled with a second input of the OR gate, an output of the OR gate being coupled with the selection input of the second shift-register MUX.

Example 8. The flexible RAM loading devices of Example 1 through Example 7, further including a third shift-register MUX including: a first input coupled with an output of the second data section; a second input coupled with a third external data pin; an output coupled with an input of a fourth data section of the shift register; and a selection input coupled with the first test-register selection bit, the output of the third shift-register MUX depending on the first test-register selection bit.

Example 9. A method to load data into a RAM including: setting a parallel loading mode of a flexible RAM loader depending on a number of free pins available for parallel loading; loading data into a shift register in parallel from each of the number of free pins available for parallel loading and a data input; and transmitting data loaded into the shift register to the RAM.

Example 10. The method of Example 9, further including executing test operations determined by the data transmitted to the RAM by a central processor unit to perform.

Example 11. The methods of Example 9 and Example 10, wherein the number of free pins available equals one.

Example 12. The methods of Example 9 through Example 11, wherein the number of free pins available equals seven.

Example 13. The methods of Example 9 through Example 12, further including setting the flexible RAM loader to a different parallel mode in response to a change in the number of free pins available for parallel loading.

Example 14. The methods of Example 9 through Example 13, further including setting the flexible RAM loader to a serial loading mode in response to a change in the number of free pins available for parallel loading.

Example 15. The methods of Example 9 through Example 14, wherein setting the parallel loading mode of the flexible RAM loader includes loading configuration bits into the shift register and transmitting the configuration bits to a test register.

Example 16. The methods of Example 9 through Example 15, wherein transmitting data loaded into the shift register to the RAM includes transmitting the data into the shift register, enabling a MUX to output the data, and providing the data to the RAM.

Example 17. The methods of Example 9 through Example 16, wherein data loaded into the shift register originates from Automatic Tester Equipment.

Example 18. A flexible RAM loader including: a shift register including a first data section coupled with a serial data input, and a second data section selectively coupled with a first parallel data input, the shift register being configured to load data serially from the serial data input to the first data section and the second data section when the second data section is uncoupled from the first parallel data input, and, when the second data section is coupled with the first parallel data input, configured to load data in parallel from the serial data input into the first data section and from the first parallel data input into the second data section; and a test register including a selection bit to couple the second data section with the first parallel data input.

Example 19. The flexible RAM loader of Example 18, wherein the shift register further includes a third section selectively coupled with a second parallel data input.

Example 20. The flexible RAM loaders of Example 19 and Example 20, wherein the test register includes a selection bit to couple the third section with the second parallel data input.

Example 21. The flexible RAM loaders of Examples 18 through Example 20, further including an Error Correction Code Generation Circuit to calculate an error correction code from data provided to the flexible RAM loader.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A flexible RAM loading device comprising:
   a shift register comprising a first data section, a second data section, and a first shift-register selection bit;
   a test register comprising a data section and a first test-register selection bit, the first test-register selection bit being loaded from the first shift-register selection bit; and
   a first shift-register MUX comprising:
   a first input coupled with an output of the first data section;
   a second input coupled with a first external data pin;
   an output coupled with an input of the second data section; and
   a selection input coupled with the first test-register selection bit, the output of the first shift-register MUX depending the first test-register selection bit.

2. The flexible RAM loading device of claim 1, wherein a serial data input is coupled with an input of the first data section to load data serially into the first data section.

3. The flexible RAM loading device of claim 1, wherein the shift register comprises RAM addressing bits, a MUX enable bit, and a RAM function bit, wherein the test register comprises RAM addressing bits that are loaded from the RAM addressing bits of the shift register, and a RAM function bit that is loaded from the RAM function bit of the shift register, a MUX enable bit that is loaded from the shift register, and further wherein the data section of the test register is loaded from the shift register.

4. The flexible RAM loading device of claim 3, wherein the MUX enable bit of the test register is provided to a selection input of MUX that toggles an output of the MUX between functional RAM control signals, and the RAM addressing bits of the test register, the RAM function bit of the test register, and the data section of the test register.

5. The flexible RAM loading device of claim 1, further comprising:
   a second shift-register MUX comprising:
   a first input coupled with an output of the second data section;
   a second input coupled with a second external data pin;
   an output coupled with an input of a third data section of the shift register; and
   a selection input coupled with a second test-register selection bit, the output of the second shift-register MUX depending the second test-register selection bit and the first test-register selection bit.

6. The flexible RAM loading device of claim 5, wherein the second test-register selection bit is loaded from a second shift-register selection bit.

7. The flexible RAM loading device of claim 5, wherein the first test-register selection bit is coupled with a first input of an OR gate and the second test-register selection bit is coupled with a second input of the OR gate, an output of the OR gate being coupled with the selection input of the second shift-register MUX.

8. The flexible RAM loading device of claim 5, further comprising a third shift-register MUX comprising:
   a first input coupled with an output of the second data section;
   a second input coupled with a third external data pin;
   an output coupled with an input of a fourth data section of the shift register; and
   a selection input coupled with the first test-register selection bit, the output of the third shift-register MUX depending on the first test-register selection bit.

9. A flexible RAM loader comprising:
   a shift register comprising a first data section coupled with a serial data input, and a second data section selectively coupled with a first parallel data input, the shift register being configured to load data serially from the serial data input to the first data section and the second data section when the second data section is uncoupled from the first parallel data input, and, when the second data section is coupled with the first parallel data input, configured to load data in parallel from the serial data input into the first data section and from the first parallel data input into the second data section; and a test register comprising a selection bit to couple the second data section with the first parallel data input.

10. The flexible RAM loader of claim 9, wherein the shift register further comprises a third section selectively coupled with a second parallel data input.

11. The flexible RAM loader of claim 10, wherein the test register comprises a selection bit to couple the third section with the second parallel data input.

12. The flexible RAM loader of claim 11, further comprising an Error Correction Code Generation Circuit to calculate an error correction code from data provided to the flexible RAM loader.

13. A device, comprising:
 a flexible random access memory (RAM) loader configured in a parallel loading mode, the parallel loading mode being based on a number of free pins available for parallel loading;
 a shift register configured to have data loaded in parallel from each of the number of free pins available for the parallel loading and a data input; and
 a RAM configured to receive data loaded into the shift register from the shift register.

14. The device of claim 13, further comprising a central processing unit configured to execute test operations determined by the data received into the RAM.

15. The device of claim 13, wherein the number of free pins available equals one.

16. The device of claim 13, wherein the number of free pins available equals seven.

17. The device of claim 13, wherein the flexible RAM loader is configured in a different parallel loading mode in response to a change in the number of free pins available for parallel loading.

18. The device of claim 13, wherein the flexible RAM loader is configured in a serial loading mode in response to a change in the number of free pins available for parallel loading.

19. The device of claim 13, wherein having the flexible RAM loader configured in parallel loading mode comprises loading configuration bits into the shift register and transmitting the configuration bits to a test register.

20. The device of claim 19, wherein receiving, by the RAM, the data loaded into the shift register from the shift register comprises transmitting the data into the shift register, enabling a MUX to output the data, and providing the data to the RAM.

21. The device of claim 20, wherein data loaded into the shift register originates from an Automatic Tester Equipment.

* * * * *